(12) United States Patent
Cai et al.

(10) Patent No.: US 11,644,509 B2
(45) Date of Patent: May 9, 2023

(54) BATTERY SYSTEM, SOC ESTIMATION METHOD FOR BATTERY SYSTEM, COMPUTER APPARATUS, AND MEDIUM

(71) Applicant: NIO TECHNOLOGY (ANHUI) CO., LTD, Hefei (CN)

(72) Inventors: Wei Cai, Hefei (CN); Rui Hua, Hefei (CN); Shizhe Tzeng, Hefei (CN); Haoming Yan, Hefei (CN)

(73) Assignee: NIO TECHNOLOGY (ANHUI) CO., LTD., Hefei (CN)

( * ) Notice: Subject to any disclaimer, the term of this patent is extended or adjusted under 35 U.S.C. 154(b) by 0 days.

(21) Appl. No.: 17/225,288

(22) Filed: Apr. 8, 2021

(65) Prior Publication Data
US 2022/0221515 A1    Jul. 14, 2022

(30) Foreign Application Priority Data

Jan. 8, 2021    (CN) .................. 202110023720.X

(51) Int. Cl.
| | | |
|---|---|---|
| G01R 31/367 | (2019.01) | |
| H02J 7/00 | (2006.01) | |
| B60L 58/21 | (2019.01) | |
| G01R 31/396 | (2019.01) | |
| G01R 31/382 | (2019.01) | |
| G07C 5/12 | (2006.01) | |

(52) U.S. Cl.
CPC ......... *G01R 31/367* (2019.01); *G01R 31/382* (2019.01); *G01R 31/396* (2019.01); *G07C 5/12* (2013.01); *H02J 7/0048* (2020.01); *B60L 58/21* (2019.02)

(58) Field of Classification Search
CPC .. G01R 31/367; G01R 31/396; G01R 31/382; H02J 7/0048; G07C 5/12; B60L 58/21
USPC .................................. 324/425–437
See application file for complete search history.

(56) References Cited

U.S. PATENT DOCUMENTS

| | | | |
|---|---|---|---|
| 2007/0166607 A1 | 7/2007 | Okada et al. | |
| 2010/0052618 A1* | 3/2010 | Inoue | G01R 31/389 320/134 |
| 2017/0363690 A1* | 12/2017 | Kawamura | H01M 10/48 |
| 2020/0381928 A1* | 12/2020 | Isaksson | B60L 58/20 |

FOREIGN PATENT DOCUMENTS

| | | |
|---|---|---|
| JP | H08-315793 | 11/1996 |
| JP | 2001-086604 | 3/2001 |
| JP | 2013-089523 | 5/2013 |

OTHER PUBLICATIONS

Extended Search Report for European Patent Application No. 21168363.6, dated Oct. 26, 2021, 9 pages.

* cited by examiner

*Primary Examiner* — Lee E Rodak
*Assistant Examiner* — Trung Q Nguyen
(74) *Attorney, Agent, or Firm* — Sheridan Ross P.C.

(57) ABSTRACT

An estimation method for a battery system includes mapping an upper limit and a lower limit of the state of charge of the second-system battery to a state of charge interval of the battery system, to establish a mapping relationship between the upper limit and the lower limit of the state of charge of the second-system battery and the state of charge interval of the battery system. The method includes calculating the state of charge of the second-system battery and estimating a state of charge of the battery system according to the mapping relationship.

18 Claims, 3 Drawing Sheets

BATTERY SYSTEM, SOC ESTIMATION METHOD FOR BATTERY SYSTEM, COMPUTER APPARATUS, AND MEDIUM

CROSS-REFERENCE TO RELATED APPLICATION

This application claims the benefit of China Patent Application No. 202110023720.X filed Jan. 8, 2021, the entire contents of which are incorporated herein by reference.

TECHNICAL FIELD

The invention relates to the technical field of vehicle batteries, and more specifically to a battery system comprising two systems of batteries, a state of charge (SOC) estimation method for the battery system, a computer apparatus, and a medium.

BACKGROUND ART

With the vigorous development and popularization of electric vehicles, users have increasingly high requirements for battery safety performance. Traction batteries currently used in the electric vehicles are mainly classified into lithium iron phosphate-system batteries (LFP) and nickel cobalt manganese-system batteries (NCM). As the lithium iron phosphate-system batteries have more excellent safety performance, more or more electric vehicles use the lithium iron phosphate-system batteries in recent years.

State of charge (SOC) estimation for a vehicle battery is the core issue in a battery management system (BMS). Accurate estimation of a state of charge of a battery facilitates the development of appropriate control strategies for the vehicle, thereby prolonging the service life of the battery and alleviating range anxiety of a user. Commonly used state of charge estimation methods are classified into a state of charge estimation method based on current integration plus open-circuit voltage (OCV) calibration and a state of charge estimation method based on a battery model. These methods all require calculating an open-circuit voltage of a battery and obtaining a state of charge based on mapping of offline experiment results. These methods require an OCV-SOC curve of the battery to have a large slope, so as to accurately map an open-circuit voltage to a state of charge after obtaining the open-circuit voltage.

As shown in FIG. 1, the OCV-SOC curve of a lithium iron phosphate-system battery is exceptionally flat, and usually, an open-circuit voltage OCV value can be mapped to a wide range of state of charge (SOC) values. This makes it impossible to accurately estimate a state of charge of the lithium iron phosphate-system battery unable. State of charge estimation for the lithium iron phosphate-system battery is a challenge in the industry.

SUMMARY OF THE INVENTION

The invention is implemented to resolve one or more of the above problems or other problems, and the used technical solutions are as follows.

According to one aspect of the invention, a state of charge (SOC) estimation method for a battery system is provided, wherein the battery system comprises a first-system battery and a second-system battery, and the method comprises: mapping an upper limit and a lower limit of a state of charge of the second-system battery to a state of charge interval of the battery system, to establish a mapping relationship between the upper limit and the lower limit of the state of charge of the second-system battery and the state of charge interval of the battery system; and calculating the state of charge of the second-system battery and estimating a state of charge of the battery system according to the mapping relationship.

Further, in one aspect of the invention, the method further comprises: dynamically adjusting the state of charge interval of the first-system battery and the state of charge interval of the second-system battery, such that the state of charge of the second-system battery always accurately reflects the state of charge of the battery system.

Further, in one aspect of the invention, said dynamically adjusting comprises: setting a lower limit of a state of charge of the first-system battery to be lower than the lower limit of the state of charge of the second-system battery, and setting the upper limit of the state of charge of the second-system battery to be higher than an upper limit of the state of charge of the first-system battery.

Further, in one aspect of the invention, said dynamically adjusting further comprises: opening the lower limit of the state of charge of the first-system battery and adding the opened lower limit to the state of charge interval of the second-system battery.

Further, in one aspect of the invention, said dynamically adjusting further comprises: lowering the upper limit of the state of charge of the second-system battery and adding the lowered upper limit to the interval of the first-system battery.

Further, in one aspect of the invention, said dynamically adjusting further comprises: opening the upper limit of the state of charge of the second-system battery and adding the opened upper limit to the state of charge interval of the second-system battery.

Further, in one aspect of the invention, the first-system battery is a lithium iron phosphate-system battery, and the second-system battery is a nickel cobalt manganese-system battery.

According to another aspect of the invention, a battery system is provided, wherein the battery system comprises a first-system battery and a second-system battery, and a state of charge (SOC) of the battery system is estimated by the following steps: mapping an upper limit and a lower limit of a state of charge of the second-system battery to a state of charge interval of the battery system, to establish a mapping relationship between the upper limit and the lower limit of the state of charge of the second-system battery and the state of charge interval of the battery system; and calculating the state of charge of the second-system battery and estimating the state of charge of the battery system according to the mapping relationship.

Further, according to one aspect of the invention, the system further comprises: dynamically adjusting the state of charge interval of the first-system battery and the state of charge interval of the second-system battery, such that the state of charge of the second-system battery always accurately reflects the state of charge of the battery system.

Further, in one aspect of the invention, said dynamically adjusting comprises: setting a lower limit of a state of charge of the first-system battery to be lower than the lower limit of the state of charge of the second-system battery, and setting the upper limit of the state of charge of the second-system battery to be higher than an upper limit of the state of charge of the first-system battery.

Further, in one aspect of the invention, said dynamically adjusting further comprises: opening the lower limit of the state of charge of the first-system battery and adding the opened lower limit to the state of charge interval of the second-system battery.

Further, in one aspect of the invention, said dynamically adjusting further comprises: lowering the upper limit of the state of charge of the second-system battery and adding the lowered upper limit to the interval of the first-system battery.

Further, in one aspect of the invention, said dynamically adjusting further comprises: opening the upper limit of the state of charge of the second-system battery and adding the opened upper limit to the state of charge interval of the second-system battery.

Further, in another aspect of the invention, in the battery system, the first-system battery is a lithium iron phosphate-system battery, and the second-system battery is a nickel cobalt manganese-system battery.

According to still another aspect of the invention, a computer device is provided, which comprises a memory, a processor, and a computer program stored on the memory and capable of running on the processor, wherein when the program is executed by the processor, the steps of the method according to one aspect of the invention are implemented.

According to yet another aspect of the invention, a recording medium having a computer program stored thereon is provided, wherein the program is executed by a computer to implement the steps of the method according to one aspect of the invention.

Compared with the prior art, the invention can obtain one or more of the following beneficial effects:

(1) According to the invention, two systems of batteries are combined into a battery system, such that a second-system battery (such as a nickel cobalt manganese-system battery) with a state of charge (SOC) being easy to calculate can be used to more accurately estimate an overall state of charge of the battery system.

(2) According to the invention, a state of charge interval of the second-system battery can be dynamically adjusted when batteries of different systems in the battery system are degraded at different rates, such that a state of charge of the second-system battery can always accurately reflect the overall state of charge of the battery system.

DETAILED DESCRIPTION OF EMBODIMENTS

Figure 1:
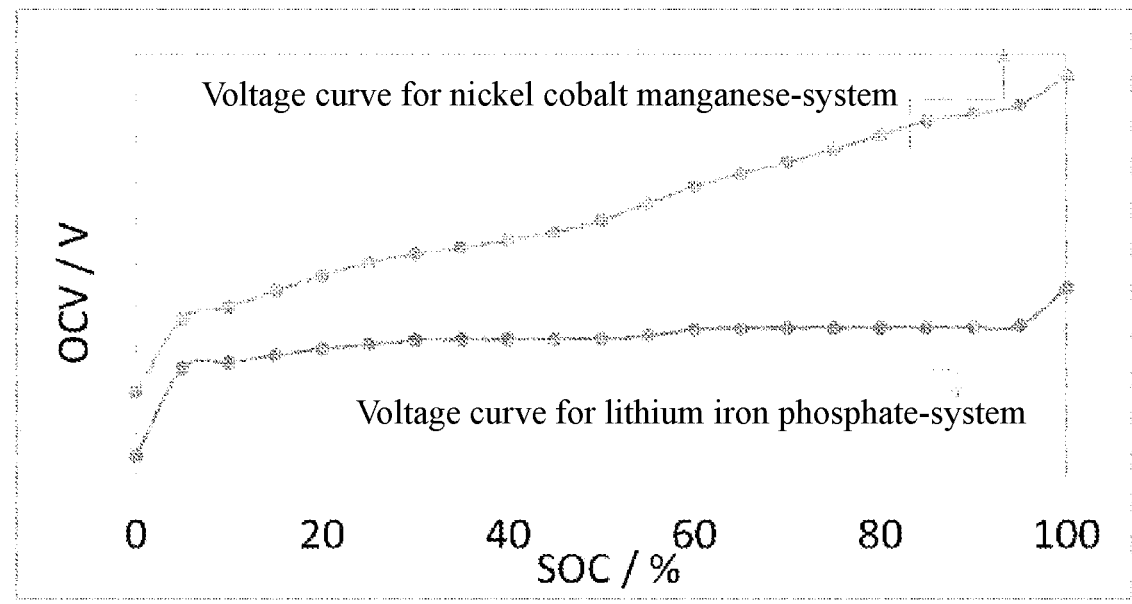
FIG. 1 shows OCV-SOC curves for a lithium iron phosphate-system battery and a nickel cobalt manganese-system battery.

A battery system, a state of charge (SOC) estimation method for the battery system, a computer device, and a recording medium according to the invention will be further described in detail below in conjunction with the accompanying drawings. It should be noted that the following detailed description of embodiments are exemplary rather than limiting, and are intended to provide a basic understanding of the invention, and are not intended to confirm key or decisive elements of the invention or limit the scope of protection.

The invention is described below with reference to block diagram descriptions, block diagrams and/or flowcharts of the methods and apparatuses in the embodiments of the invention. It will be understood that each block of these flowchart descriptions and/or block diagrams, and combinations of flowchart descriptions and/or block diagrams, can be implemented by computer program instructions. These computer program instructions may be provided for a processor of a general-purpose computer, a dedicated computer, or another programmable data processing device to generate a machine, so that the instructions executed by the processor of the computer or the another programmable data processing device create components for implementing the functions/operations specified in these flowcharts and/or blocks and/or one or more flow block diagrams.

These computer program instructions may be stored in a computer-readable memory that can instruct a computer or another programmable processor to implement the functions in a specific manner, so that the instructions stored in the computer-readable memory generate a manufactured product containing instruction components that implement the functions/operations specified in one or more blocks of the flowchart and/or the block diagram.

These computer program instructions may be loaded onto the computer or the another programmable data processor, so that a series of operations and steps are performed on the computer or the another programmable processor, to form a computer-implemented process. As such, the instructions executed on the computer or the another programmable data processor provide steps for implementing the functions or operations specified in one or more blocks in the flowchart and/or block diagram. It should also be noted that in some alternative implementations, the functions/operations shown in the blocks may not occur in the order shown in the flowchart. For example, two blocks shown in sequence may actually be executed substantially simultaneously or the blocks may sometimes be executed in a reverse order, depending on the functions/operations involved.

As described above, a battery system comprising a single system of batteries may have problems such as inaccurate state of charge measurement and low energy efficiency. Therefore, the invention provides a battery system, which comprises a plurality of batteries of different systems, for example, a first-system battery and a second-system battery. In one embodiment, the first-system battery is a lithium iron phosphate-system battery (LFP), and the second-system battery is a nickel cobalt manganese-system battery (NCM), such that a dual-system battery system is formed. In the dual-system battery system, the lithium iron phosphate-system battery may be connected to the nickel cobalt manganese-system battery in series, wherein a ratio of lithium iron phosphate-system batteries to nickel cobalt manganese-system batteries in quantity may be 5:1, 3:1, 1:1, or the like.

Figure 2:
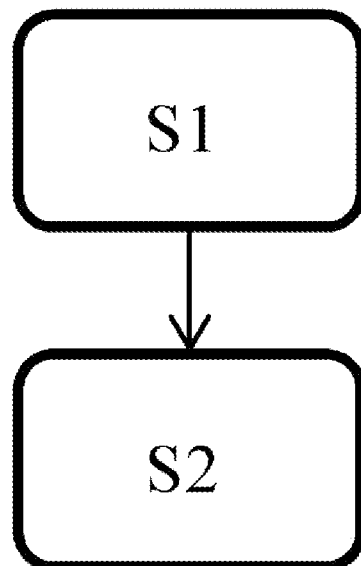
FIG. 2 is a schematic flowchart of an SOC estimation method for a battery system according to an embodiment of the invention.

FIG. 2 is a schematic flowchart of an SOC estimation method for a battery system according to an embodiment of the invention. Because an OCV-SOC curve for a nickel cobalt manganese-system battery has a large slope, an obtained OCV can be accurately mapped to an SOC. Therefore, to estimate a state of charge (SOC) of the battery system, an upper limit and a lower limit of a state of charge of a second-system battery may be mapped to a state of charge interval of the battery system, to establish a mapping relationship between the upper limit and the lower limit of the state of charge of the second-system battery and the state of charge interval of the battery system (step S1). In an embodiment where a first-system battery is a lithium iron phosphate-system battery (LFP) and the second-system battery is a nickel cobalt manganese-system battery (NCM), the upper limit and the lower limit for the nickel cobalt manganese-system battery (NCM) is mapped to the state of charge interval of the battery system, to establish the mapping relationship between the upper limit and the lower limit for the nickel cobalt manganese-system battery (NCM) and the state of charge interval of the battery system. In one embodiment, considering the possible battery degradation of the nickel cobalt manganese-system battery (NCM), the upper limit and the lower limit for the NCM can be set to 0% and 90% respectively, and can be mapped to the state of charge interval, that is, 0% to 100%, of the battery system. In this case, the mapping relationship between the upper limit and the lower limit for the nickel cobalt manganese-system battery (NCM) and the state of charge interval of the battery system is [0%, 90%]→[0%, 100%].

After the upper limit and the lower limit for the second-system battery are mapped to the state of charge interval of the battery system, the state of charge of the second-system battery may be calculated and the state of charge of the battery system may be estimated according to the mapping relationship (step S2). A state of charge may be calculated based on state of charge calculation methods known in the art, and the methods include but are not limited to an SOC estimation method based on current integration and open-circuit voltage (OCV) calibration and an SOC estimation method based on a battery model. After the state of charge (SOC) of the second-system battery, namely, the nickel cobalt manganese-system battery (NCM), is calculated, the calculated state of charge (SOC) is mapped to the state of charge (SOC) of the battery system according to the mapping relationship in step S2, so that an estimated state of charge (SOC) of the battery system can be obtained. In one embodiment, if the upper limit and the lower limit for the nickel cobalt manganese-system battery (NCM) are set to 0% and 90% respectively, and are mapped to the state of charge interval, that is, 0% to 100%, of the battery system, when the state of charge of the nickel cobalt manganese-system battery (NCM) is 0%, the state of charge of the battery system is 0%; when the state of charge of the nickel cobalt manganese-system battery (NCM) is 45%, the state of charge of the battery system is 50%; and when the state of charge of the nickel cobalt manganese-system battery (NCM) is 90%, the state of charge of the battery system is 100%.

The battery system comprising a plurality of systems of batteries is used, so that a second-system battery (such as a nickel cobalt manganese-system battery) with a state of charge (SOC) being easy to calculate can be used to more accurately estimate an overall state of charge of the battery system.

However, since a battery may be degraded during use, and batteries of different systems in a battery system comprising a plurality of systems of batteries may be degraded at different rates, it is required to dynamically adjust SOC intervals of different systems of batteries, such that the SOC interval of the second-system battery can still accurately correspond to the actual use performance of the battery in different degradation states.

Figure 3:
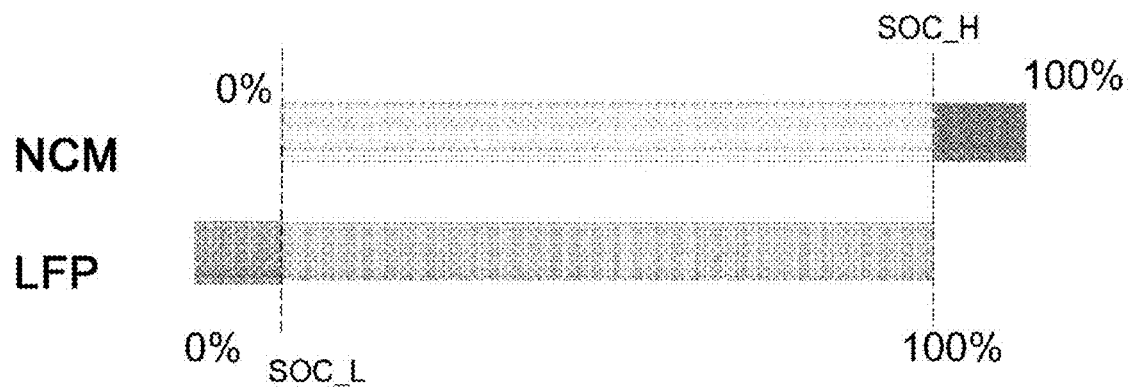
FIG. 3 shows a schematic diagram of dynamically adjusting an SOC interval of a battery system according to an embodiment of the invention.

FIG. 3 shows a schematic diagram of dynamically adjusting an SOC interval of a battery system according to an embodiment of the invention. Specifically, a lower limit of a state of charge of the first-system battery is set to be lower than the lower limit of the state of charge of the second-system battery, and the upper limit of the state of charge of the second-system battery is set to be higher than the upper limit of the state of charge of the first-system battery. As shown in FIG. 3, in one embodiment, the lower limit of the state of charge (SOC) of the first-system battery (lithium iron phosphate-system battery (LFP)) in the battery system is set to be lower than the lower limit of the state of charge (SOC) of the second-system battery (nickel cobalt manganese-system battery (NCM)), and the upper limit of the state of charge (SOC) of the nickel cobalt manganese-system battery (NCM) is correspondingly set to be higher than the upper limit of the state of charge (SOC) of the lithium iron phosphate-system battery (LFP). In this embodiment, it should be noted that due to electrical characteristics of the nickel cobalt manganese-system battery (NCM) and the lithium iron phosphate-system battery (LFP), during charging and discharging, for the nickel cobalt manganese-system battery (NCM) and the lithium iron phosphate-system battery (LFP) connected in series, the NCM may be fully discharged first, while the LFP may be fully charged first. Therefore, to ensure the state of charge (SOC) of the nickel cobalt manganese-system battery (NCM) can accurately reflect the state of charge (SOC) of the battery system, the lower limit of the state of charge (SOC) of the nickel cobalt manganese-system battery (NCM) needs to always be kept at the empty point (0%), and the upper limit of the state of charge (SOC) of the NCM needs to always be kept at the full point (100%) of the lithium iron phosphate-system battery (LFP). FIG. 3 shows such an SOC interval design. Specifically, the lower limit of the nickel cobalt manganese-system battery (NCM) is kept at the empty point (0%) of the battery system and a corresponding state of charge of the lithium iron phosphate-system battery (LFP) is referred to as SOC_L, while the upper limit of the lithium iron phosphate-system battery (LFP) is kept at the full point (100%) of the battery system and a corresponding state of charge of the nickel cobalt manganese-system battery (NCM) is referred to as SOC_H. By means of such a design, the state of charge interval of the nickel cobalt manganese-system battery (NCM) is kept as the empty point (0%) of the battery system to the full point (SOC_H) thereof, and to ensure that the state of charge interval (0% to SOC_H) is relatively stable, two state of charge intervals (0 to SOC_L) and (SOC_H to 100%) are reserved and are used to dynamically adjust the state of charge interval of the nickel cobalt manganese-system battery (NCM) when the battery system is degraded.

After the state of charge (SOC) interval of the nickel cobalt manganese-system battery (NCM) is set to be the empty point of the battery system to the full point thereof and a correspondence is set between the lithium iron phosphate-system battery (LFP) and the upper limit and the lower limit of the state of charge (SOC) of the nickel cobalt manganese-system battery (NCM), in different degradation states, the state of charge interval of the lithium iron phosphate-system battery (LFP) and the state of charge interval of the nickel cobalt manganese-system battery (NCM) are dynamically adjusted, so that the state of charge of the nickel cobalt manganese-system battery (NCM) can always accurately reflect the state of charge of the battery system in different degradation states.

As described above, the battery system comprising different systems of batteries may be degraded at different rates, and therefore, for the battery system comprising two systems of batteries, there be a case where the first-system battery is degraded more than the second-system battery and a case where the second-system battery is degraded more than the first-system battery.

Figure 4:
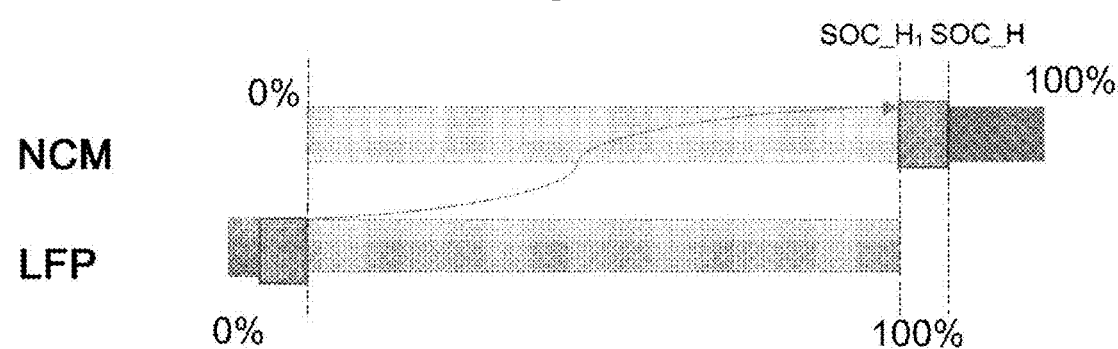
FIG. 4 shows a schematic diagram of dynamically adjusting an SOC interval of a battery system according to an embodiment of the invention.

FIG. 4 shows a schematic diagram of dynamically adjusting an SOC interval of a battery system according to an embodiment of the invention. In the embodiment shown in FIG. 4, the first-system battery is degraded more than the second-system battery. Since the first-system battery is degraded more than the second-system battery, that is, the lithium iron phosphate-system battery (LFP) is degraded more than the nickel cobalt manganese-system battery (NCM) (a battery capacity of the lithium iron phosphate-system battery (LFP) is degraded faster), the upper limit (100%) of the lithium iron phosphate-system battery (LFP) is shifted downwards relative to that of the nickel cobalt manganese-system battery (NCM). As shown in FIG. 4, the upper limit of the lithium iron phosphate-system battery (LFP) corresponds to $SOC\_H_1$ of the nickel cobalt manganese-system battery (NCM) and $SOC\_H_1 < SOC\_H$. This causes the state of charge interval of the nickel cobalt manganese-system battery (NCM) to be 0 to $SOC\_H_1$, and this range is reduced compared to the original 0 to SOC_H. To keep the state of charge interval of the nickel cobalt manganese-system battery (NCM) unchanged, the state of charge interval, that is, 0% to SOC_L, of the lithium iron phosphate-system battery (LFP) is gradually opened. The opened capacity of charge is $(SOC\_H - SOC\_H_1) \times weight$, where weight is usually an adjustment coefficient greater than 1 (such as 1.1, 1.3, or 1.5), and the coefficient is adjustable during the actual operation of the battery system and specifically depends on a capacity comparison relationship between the nickel cobalt manganese-system battery (NCM) and the lithium iron phosphate-system battery (LFP). In the state of charge interval, that is, 0% to SOC_L, of the lithium iron phosphate-system battery (LFP) is gradually opened, a capacity of charge with a value of $(SOC\_H - SOC\_H_1) \times weight$ is opened downwards, and this part of capacity opened downwards is added to the nickel cobalt manganese-system battery (NCM). This ensures that an available state of charge (SOC) interval of the nickel cobalt manganese-system battery (NCM) is still 0 to SOC_H. By means of the dynamically adjusted state of charge interval of the nickel cobalt manganese-system battery (NCM), the state of charge of the nickel cobalt manganese-system battery (NCM) can always accurately reflect the overall state of charge of the battery system.

Figure 5:
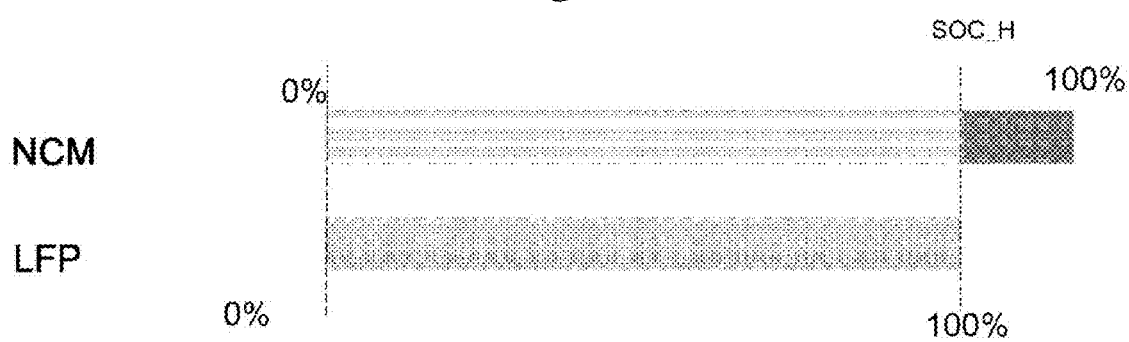
FIG. 5 shows a dynamically adjusted SOC interval of a battery system according to an embodiment of the invention.

FIG. 5 shows a dynamically adjusted SOC interval of a battery system according to an embodiment of the invention. In FIG. 5, the first-system battery is continuously degraded and the first-system battery has been degraded more than that of the second-system battery by a threshold. As shown in FIG. 4, the opening for the lithium iron phosphate-system battery (LFP) is limited, that is, a maximum of the state of charge interval (0% to SOC_L) is opened. Referring back to FIG. 5, when the lithium iron phosphate-system battery (LFP) is degraded by the threshold (0% to SOC_L), that is, the lower limit interval of the lithium iron phosphate-system battery (LFP) has been completely opened and is added to the nickel cobalt manganese-system battery (NCM), the state of charge (SOC) of the nickel cobalt manganese-system battery (NCM) and same of the lithium iron phosphate-system battery (LFP) have the same lower limit, that is, 0%. In this case, the lithium iron phosphate-system battery (LFP) will be fully discharged first, such that the state of charge of the nickel cobalt manganese-system battery (NCM) in this case cannot accurately reflect the empty point of the battery system. To enable the state of charge interval of the nickel cobalt manganese-system battery (NCM) to still accurately reflect the state of charge interval (the empty point to the full point) of the battery system, a part of the state of charge capacity of the nickel cobalt manganese-system battery (NCM) needs to be reversely added to the lower limit interval of the lithium iron phosphate-system battery (LFP).

Figure 6:
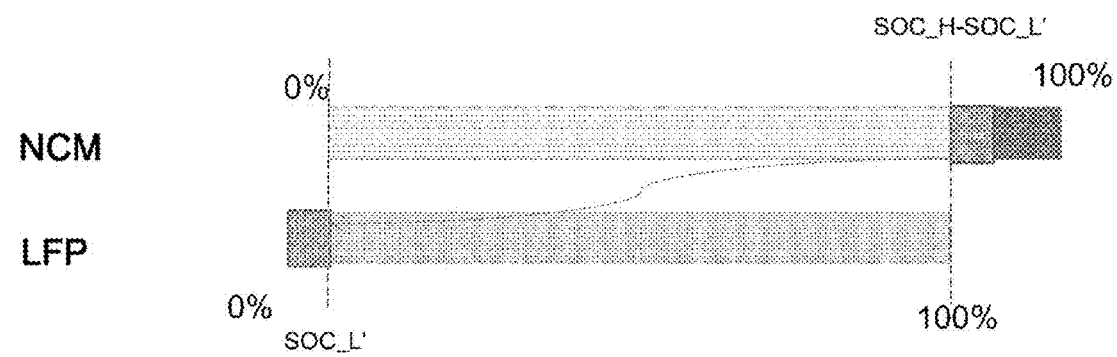
FIG. 6 shows another schematic diagram of dynamically adjusting an SOC interval of a battery system according to an embodiment of the invention.

FIG. 6 shows another schematic diagram of dynamically adjusting an SOC interval of a battery system according to an embodiment of the invention. In the embodiment shown in FIG. 6, a part of the state of charge (SOC) of the nickel cobalt manganese-system battery (NCM) is reversely added to the lower limit interval of the lithium iron phosphate-system battery (LFP). Specifically, the upper limit of the nickel cobalt manganese-system battery (NCM) is set to (SOC_H−SOC_L'), where SOC_L' is a state of charge (SOC) value corresponding to the percentage of SOC_L converted from the capacity of the LFP to the capacity of the NCM. Also, the capacity of the nickel cobalt manganese-system battery (NCM) corresponding to SOC_L' is added to the lithium iron phosphate-system battery (LFP). In such adjustment, the upper limit of the nickel cobalt manganese-system battery (NCM) still corresponds to the full point of the battery system (also the full point of the lithium iron phosphate-system battery (LFP)), and the lower limit still corresponds to the empty point of the nickel cobalt manganese-system battery (NCM) (also the empty point of the nickel cobalt manganese-system battery (NCM)). The adjusted state of charge interval (0 to (SOC_H−SOC_L')) of the nickel cobalt manganese-system battery (NCM) can still accurately reflect the state of charge (SOC) of the battery system. If the lithium iron phosphate-system battery (LFP) is still continuously degraded more than the nickel cobalt manganese-system battery (NCM), the steps of FIG. 6 are repeated.

Figure 7:
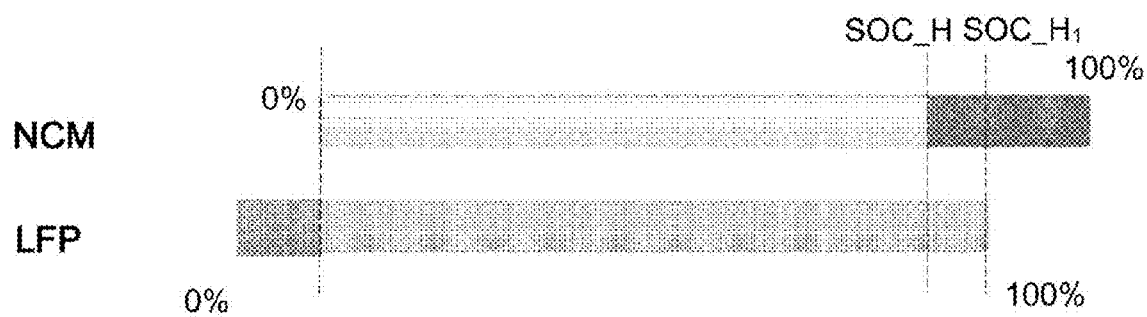
FIG. 7 shows a schematic diagram of dynamically adjusting an SOC interval of a battery system according to an embodiment of the invention.

FIG. 7 shows a schematic diagram of dynamically adjusting an SOC interval of a battery system according to an embodiment of the invention. In the embodiment shown in FIG. 6, the second-system battery is degraded more than the first-system battery, that is, the nickel cobalt manganese-system battery (NCM) is degraded more than the lithium iron phosphate-system battery (LFP), the full point of the lithium iron phosphate-system battery (LFP) is shifted upwards relative to that of the nickel cobalt manganese-system battery (NCM). As shown in FIG. 6, the full point of the lithium iron phosphate-system battery (LFP) corresponds to $SOC\_H_1$ of the nickel cobalt manganese-system battery (NCM). In this case, the interval (SOC_H to 100%) of the nickel cobalt manganese-system battery (NCM) is gradually opened upwards, so that the interval is aligned with the full point of the LFP. In this way, the available state of charge (SOC) of the nickel cobalt manganese-system battery (NCM) is kept as (0% to $SOC\_H_1$), and the state of charge (SOC) of the battery system is estimated according to adjusted (0% to $SOC\_H_1$). Since the adjusted state of charge interval (0% to $SOC\_H_1$) of the nickel cobalt manganese-system battery (NCM) still corresponds to the empty point of the battery system to the full point thereof, the interval can accurately reflect the state of charge SOC of the battery system.

As described above, the state of charge interval of the second-system battery (nickel cobalt manganese-system battery (NCM)) can be dynamically adjusted when different types of degradations occur in the battery system comprising different systems of batteries, such that the state of charge interval of the second-system battery (nickel cobalt manganese-system battery (NCM)) can always accurately reflect the state of charge (SOC) of the battery system. Therefore, even if different degradations occur in the battery system, the state of charge interval of the second-system battery is dynamically adjusted, such that a calculated current state of charge (SOC) of the second-system battery can always accurately obtain the current state of charge (SOC) of the battery system through mapping.

According to another aspect of the invention, a battery system is further provided, wherein the battery system comprises a first-system battery and a second-system battery. In one embodiment, the first-system battery is a lithium iron phosphate-system battery (LFP), and the second-system battery is a nickel cobalt manganese-system battery (NCM), such that a dual-system battery system is formed. In the dual-system battery system, the lithium iron phosphate-system battery may be connected to the nickel cobalt manganese-system battery in series, wherein a ratio of lithium iron phosphate-system batteries to nickel cobalt manganese-system batteries in quantity may be 5:1, 3:1, 1:1, or the like. To estimate the state of charge (SOC) of the battery system, an upper limit and a lower limit of a state of charge of a second-system battery may be mapped to a state of charge interval of the battery system, to establish a mapping relationship between the upper limit and the lower limit of the state of charge of the second-system battery and the state of charge interval of the battery system, that is, the upper limit and the lower limit of the nickel cobalt manganese-system battery (NCM) are mapped to the state of charge interval of the battery system. In one embodiment, considering the possible battery degradation of the nickel cobalt manganese-system battery (NCM), the upper limit and the lower limit for the NCM can be set to 0% and 90% respectively, and can be mapped to the state of charge interval, that is, 0% to 100%, of the battery system. In this case, the mapping relationship between the upper limit and the lower limit for the nickel cobalt manganese-system battery (NCM) and the state of charge interval of the battery system is [0%, 90%]→[0%, 100%].

After the upper limit and the lower limit for the second-system battery are mapped to the state of charge interval of the battery system, the state of charge of the second-system battery may be calculated and the state of charge of the battery system can be estimated according to the mapping relationship. A state of charge may be calculated based on state of charge calculation methods known in the art, and the methods include but are not limited to an SOC estimation method based on current integration and open-circuit voltage (OCV) calibration and an SOC estimation method based on a battery model. After the state of charge (SOC) of the second-system battery, namely, the nickel cobalt manganese-system battery (NCM), is calculated, the calculated state of charge (SOC) is mapped to the state of charge (SOC) of the battery system according to the mapping relationship in step S2, so that an estimated state of charge (SOC) of the battery system can be obtained. In one embodiment, if the upper limit and the lower limit for the nickel cobalt manganese-system battery (NCM) are set to 0% and 90% respectively, and are mapped to the state of charge interval, that is, 0% to 100%, of the battery system, when the state of charge of the nickel cobalt manganese-system battery (NCM) is 0%, the state of charge of the battery system is 0%; when the state of charge of the nickel cobalt manganese-system battery (NCM) is 45%, the state of charge of the battery system is 50%; and when the state of charge of the nickel cobalt manganese-system battery (NCM) is 90%, the state of charge of the battery system is 100%.

When a battery is degraded in the battery system, the state of charge (SOC) interval based on the second-system battery in the battery system can be dynamically adjusted. The specific manner thereof is the same as that in the foregoing, and will not be described herein again.

Although descriptions are given above centered on the embodiments of the state of charge (SOC) battery estimation method for the battery system and the battery system, the invention is not limited to these embodiments, and the invention may be implemented in a way of: a computer device for performing the method described above or a computer program for performing the method described above, or a computer program for implementing functions of apparatus described above or a computer-readable recording medium having the computer program recorded thereon.

Figure 8:
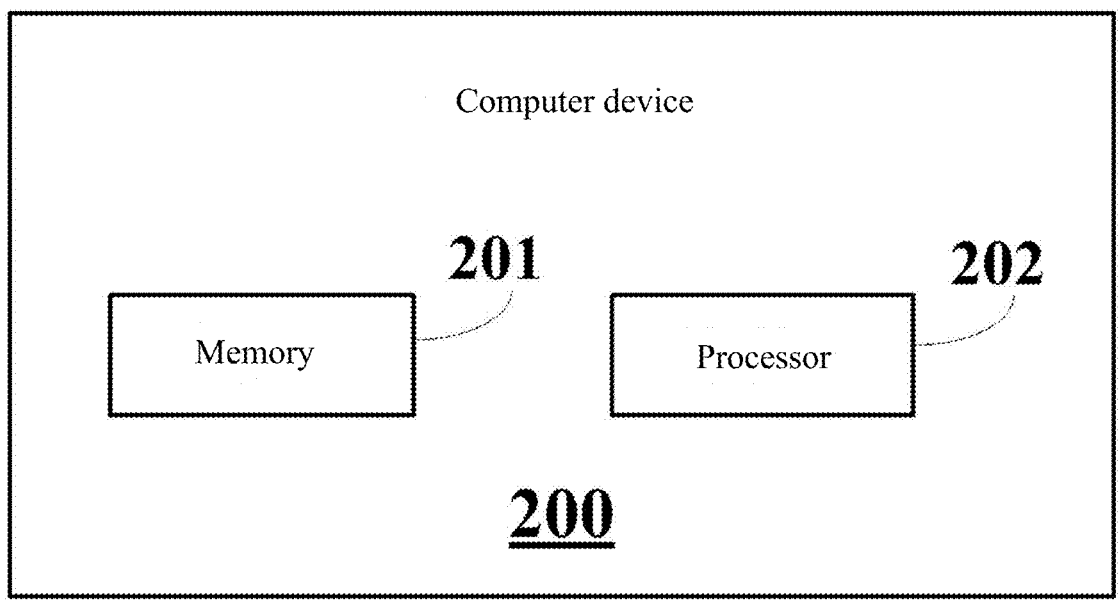
FIG. 8 is an example block diagram of a computer device, of the method described herein, according to an embodiment of the invention.

FIG. 8 shows a computer device for the above-mentioned method state of charge (SOC) estimation method for a battery system, according to an embodiment of the invention. As shown in FIG. 8, a computer device 200 comprises a memory 201 and a processor 202. Although not shown, the computer device 200 further comprises a computer program stored on the memory 201 and capable of running on the processor 202. When the program is executed by the processor, the steps shown in FIGS. 2, 3, 4, 6, and 7 are implemented.

In addition, as described above, the invention may also be implemented as a recording medium, which stores a program for enabling a computer to perform the above-mentioned state of charge (SOC) estimation method for the battery system.

Here, various recording media, such as disks (e.g., a magnetic disk, an optical disc, etc.), cards (e.g., a memory card, an optical card, etc.), semiconductor memories (e.g., a ROM, a non-volatile memory, etc.), and tapes (e.g., a magnetic tape, a cassette tape, etc.), can be used as the recording medium.

By recording, in these recording media, a computer program that enables a computer to perform the method for adjusting battery swap requirement distribution for a battery swap station in the embodiments above or a computer program that enables a computer to implement functions of the apparatus for adjusting battery swap requirement distribution for a battery swap station in the embodiments above and circulating the computer program, costs are reduced, and portability and versatility are improved.

Furthermore, the recording medium is loaded on a computer, the computer reads the computer program recorded in the recording medium and stores same in a memory, and a processor (central processing unit (CPU) and a micro processing unit (MPU)) provided on the computer reads out and executes the computer program from the memory, whereby the method for adjusting battery swap requirement distribution for a battery swap station in the embodiments above can be performed, and functions of the apparatus for adjusting battery swap requirement distribution for a battery swap station in the embodiments above can be implemented.

Those of ordinary skill in the art should understand that the invention is not limited to the embodiments above, and the invention can be implemented in many other forms without departing from the essence and scope thereof. For example, although all the embodiments of the invention are based on the battery system with two systems of batteries, those skilled in the art can figure out that a similar battery system comprising three or more different systems of batteries and a similar state of charge estimation method are used to obtain the state of charge of the battery system. Therefore, the presented examples and embodiments are regarded to be schematic rather than restrictive, and without departing from the spirit and scope of the invention that are defined by the appended claims, the invention may cover various changes and replacements.

The invention claimed is:

1. A state of charge (SOC) estimation method for a battery system, wherein the battery system comprises a first-system battery and a second-system battery, and the method comprises:
    mapping, by a processor, an upper limit and a lower limit of a state of charge of the second-system battery to a state of charge interval of the battery system to establish a mapping relationship between the upper limit and the lower limit of the state of charge of the second-system battery and the state of charge interval of the battery system, wherein the first-system battery is a lithium iron phosphate-system battery, and the second-system battery is a nickel cobalt manganese-system battery;
    determining an open-circuit voltage of the second-system battery;
    calculating, by the processor, the state of charge of the second-system battery based on the open-circuit voltage of the second-system battery and estimating, using the calculated state of charge of the second-system battery, a state of charge of the battery system according to the mapping relationship, the estimated state of charge of the battery system being a value that reflects the state of charge of the second-system battery and a state of charge of the first-system battery; and
    dynamically adjusting, by the processor, a state of charge interval of the first-system battery and a state of charge interval of the second-system battery by setting a lower limit of a state of charge of the first-system battery to be lower than the lower limit of the state of charge of the second-system battery, and setting the upper limit of the state of charge of the second-system battery to be higher than an upper limit of the state of charge of the first-system battery, such that the state of charge of the second-system battery always accurately reflects the state of charge of the battery system.

2. The method according to claim 1, further comprising: determining at least one characteristic of the battery system based on the estimated state of charge of the battery system.

3. The method according to claim 2, wherein the at least one characteristic of the battery system comprises one or more of a service life of the battery system and a driving range of a vehicle powered by the battery system.

4. The method according to claim 1, wherein said dynamically adjusting further comprises: opening the lower limit of the state of charge of the first-system battery and adding the opened lower limit to the state of charge interval of the second-system battery.

5. The method according to claim 4, wherein said dynamically adjusting further comprises: lowering the upper limit of the state of charge of the second-system battery and adding the lowered upper limit to the state of charge interval of the first-system battery.

6. The method according to claim 1, wherein said dynamically adjusting further comprises: opening the upper limit of the state of charge of the second-system battery and adding the opened upper limit to the state of charge interval of the second-system battery.

7. A battery system, comprising:
    a first-system battery;
    a second-system battery;
    a processor; and
    a memory including instructions that when executed by the processor cause the processor to:
        map an upper limit and a lower limit of a state of charge of the second-system battery to a state of charge interval of the battery system, to establish a mapping relationship between the upper limit and the lower limit of the state of charge of the second-system battery and the state of charge interval of the battery system, wherein the first-system battery is a lithium iron phosphate-system battery, and the second-system battery is a nickel cobalt manganese-system battery;
        determine an open-circuit voltage of the second-system battery;
        calculate the state of charge of the second-system battery based on the open-circuit voltage of the second-system battery and estimate, using the calculated state of charge of the second-system battery, the state of charge of the battery system according to the mapping relationship, the estimated state of charge of the battery system being a value that reflects the state of charge of the second-system battery and a state of charge of the first-system battery; and
        dynamically adjust a state of charge interval of the first-system battery and a state of charge interval of the second-system battery by setting a lower limit of a state of charge of the first-system battery to be lower than the lower limit of the state of charge of the second-system battery, and setting the upper limit of the state of charge of the second-system battery to be higher than an upper limit of the state of charge of the first-system battery, such that the state of charge of the second-system battery always accurately reflects the state of charge of the battery system.

8. The battery system according to claim 7, further comprising: determining at least one characteristic of the battery system based on the estimated state of charge of the battery system.

9. The battery system according to claim 8, wherein the at least one characteristic of the battery system comprises one or more of a service life of the battery system and a driving range of a vehicle powered by the battery system.

10. The battery system according to claim 7, wherein said dynamically adjusting further comprises: opening the lower limit of the state of charge of the first-system battery and adding the opened lower limit to the state of charge interval of the second-system battery.

11. The battery system according to claim 10, wherein said dynamically adjusting further comprises: lowering the upper limit of the state of charge of the second-system battery and adding the lowered upper limit to the state of charge interval of the first-system battery.

12. The battery system according to claim 7, wherein said dynamically adjusting further comprises: opening the upper limit of the state of charge of the second-system battery and adding the opened upper limit to the state of charge interval of the second-system battery.

13. The battery system according to claim 7, wherein the first-system battery and the second-system battery are connected in series.

14. A computer device, comprising:
   a memory;
   a processor; and
   a computer program stored on the memory and executable on the processor, wherein when the computer program is executed by the processor, the processor:
   maps an upper limit and a lower limit of a state of charge of a second-system battery to a state of charge interval of a battery system, to establish a mapping relationship between the upper limit and the lower limit of the state of charge of the second-system battery and the state of charge interval of the battery system, the battery system including a first-system battery and the second-system battery, wherein the first-system battery is a lithium iron phosphate-system battery, and the second-system battery is a nickel cobalt manganese-system battery;
   determines an open-circuit voltage of the second-system battery;
   calculates the state of charge of the second-system battery based on the open-circuit voltage of the second-system battery and estimate, using the calculated state of charge of the second-system battery, the state of charge of the battery system according to the mapping relationship, the estimated state of charge of the battery system being a value that reflects the state of charge of the second-system battery and a state of charge of the first-system battery; and
   dynamically adjusts a state of charge interval of the first-system battery and a state of charge interval of the second-system battery by setting a lower limit of a state of charge of the first-system battery to be lower than the lower limit of the state of charge of the second-system battery, and setting the upper limit of the state of charge of the second-system battery to be higher than an upper limit of the state of charge of the first-system battery, such that the state of charge of the second-system battery always accurately reflects the state of charge of the battery system.

15. The computer device according to claim 14, wherein the processor determines at least one characteristic of the battery system based on the estimated state of charge of the battery system.

16. The computer device according to claim 15, wherein the at least one characteristic of the battery system comprises one or more of a service life of the battery system and a driving range of a vehicle powered by the battery system.

17. The computer device according to claim 16, wherein said dynamically adjusting further comprises: opening the lower limit of the state of charge of the first-system battery and adding the opened lower limit to the state of charge interval of the second-system battery.

18. The computer device according to claim 17, wherein said dynamically adjusting further comprises: lowering the upper limit of the state of charge of the second-system battery and adding the lowered upper limit to the state of charge interval of the first-system battery.

* * * * *